(12) United States Patent
Xiao et al.

(10) Patent No.: US 11,385,536 B2
(45) Date of Patent: Jul. 12, 2022

(54) EUV MASK BLANKS AND METHODS OF MANUFACTURE

(71) Applicant: Applied Materials, Inc., Santa Clara, CA (US)

(72) Inventors: Wen Xiao, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 16/944,556

(22) Filed: Jul. 31, 2020

(65) Prior Publication Data

US 2021/0041781 A1 Feb. 11, 2021

Related U.S. Application Data

(60) Provisional application No. 62/884,396, filed on Aug. 8, 2019.

(51) Int. Cl.
 *G03F 1/24* (2012.01)
(52) U.S. Cl.
 CPC .................................... *G03F 1/24* (2013.01)
(58) Field of Classification Search
 CPC ......................................................... G03F 1/24
 USPC ............................................................. 430/5
 See application file for complete search history.

(56) References Cited

U.S. PATENT DOCUMENTS

| | | | |
|---|---|---|---|
| 4,410,407 A | 10/1983 | Macaulay | |
| 5,641,593 A | 6/1997 | Watanabe et al. | |
| 5,944,967 A | 8/1999 | Kunz et al. | |
| 6,013,399 A | 1/2000 | Nguyen | |
| 6,132,566 A | 10/2000 | Hofmann et al. | |
| 6,323,131 B1 | 11/2001 | Obeng et al. | |
| 6,396,900 B1 | 5/2002 | Barbee, Jr. et al. | |
| 6,818,361 B2 | 11/2004 | Yan | |
| 8,587,662 B1 | 11/2013 | Moll | |
| 8,691,476 B2 | 4/2014 | Yu et al. | |
| 8,802,335 B2 | 8/2014 | Oh et al. | |
| 8,932,785 B2 | 1/2015 | Utzny | |
| 9,329,597 B2 | 5/2016 | Stoschek et al. | |
| 9,580,796 B2 | 2/2017 | Ritchie et al. | |
| 9,612,522 B2 | 4/2017 | Hassan et al. | |
| 9,812,303 B2 | 11/2017 | Ritchie et al. | |
| 10,747,102 B2 | 8/2020 | Jindal | |
| 2003/0091910 A1 | 5/2003 | Schwarzl et al. | |
| 2003/0147058 A1 | 8/2003 | Murakami et al. | |
| 2003/0203289 A1 | 10/2003 | Yan et al. | |
| 2004/0151988 A1 | 8/2004 | Silverman | |
| 2004/0213971 A1 | 10/2004 | Colburn et al. | |
| 2004/0214113 A1 | 10/2004 | Goldstein et al. | |
| 2005/0074676 A1 | 4/2005 | Watanabe et al. | |
| 2005/0084773 A1 | 4/2005 | Krauth | |
| 2005/0208389 A1 | 9/2005 | Ishibashi et al. | |
| 2005/0227152 A1 | 10/2005 | Yan et al. | |
| 2005/0282072 A1 | 12/2005 | Hector et al. | |
| 2006/0029866 A1 | 2/2006 | Schwarzl et al. | |
| 2006/0251973 A1 | 11/2006 | Takaki et al. | |
| 2007/0020903 A1 | 1/2007 | Takehara et al. | |
| 2007/0090084 A1 | 4/2007 | Yan et al. | |
| 2008/0248409 A1 | 10/2008 | Ishibashi et al. | |
| 2009/0130569 A1 | 5/2009 | Quesnel | |
| 2010/0027107 A1 | 2/2010 | Yakshin et al. | |
| 2010/0167181 A1 | 7/2010 | Kim | |
| 2011/0020737 A1 | 1/2011 | Kamo et al. | |
| 2011/0104595 A1 | 5/2011 | Hayashi et al. | |
| 2011/0168545 A1 | 7/2011 | Shibamoto | |
| 2012/0069311 A1 | 3/2012 | Schwarzl et al. | |
| 2012/0088315 A1 | 4/2012 | Merelle et al. | |
| 2012/0129083 A1 | 5/2012 | Yoshimori et al. | |
| 2012/0322000 A1 | 12/2012 | Uno et al. | |
| 2013/0100428 A1 | 4/2013 | Ruoff et al. | |
| 2013/0162726 A1 | 6/2013 | Mizukami et al. | |
| 2013/0209927 A1 | 8/2013 | Deweerd | |
| 2013/0217238 A1 | 8/2013 | Boussie et al. | |
| 2013/0323626 A1 | 12/2013 | Chang | |
| 2014/0051015 A1 | 2/2014 | Gallagher | |
| 2014/0192335 A1 | 7/2014 | Hagio et al. | |
| 2014/0205936 A1 | 7/2014 | Kodera et al. | |
| 2014/0212794 A1 | 7/2014 | Maeshige et al. | |
| 2014/0218713 A1 | 8/2014 | Lu et al. | |
| 2014/0248555 A1 | 9/2014 | Chang et al. | |
| 2014/0254001 A1 | 9/2014 | Sun et al. | |
| 2014/0254018 A1 | 9/2014 | Sun et al. | |
| 2014/0254890 A1 | 9/2014 | Bergman | |
| 2014/0268080 A1 | 9/2014 | Beasley et al. | |
| 2014/0272681 A1 | 9/2014 | Huang et al. | |

(Continued)

FOREIGN PATENT DOCUMENTS

| CN | 1900359 A | 1/2007 |
|---|---|---|
| EP | 3454119 A1 | 3/2019 |

(Continued)

OTHER PUBLICATIONS

Non-Final Office Action in U.S. Appl. No. 16/662,753 dated Jun. 17, 2021, 6 pages.
Non-Final Office Action in U.S. Appl. No. 16/801,635, dated Jul. 6, 2021, 10 pages.
Extended European Search Report in EP15819417.5 dated Nov. 2, 2017, 11 pages.
Final Office Action in U.S. Appl. No. 16/229,659 dated Jul. 1, 2020, 10 pages.

(Continued)

*Primary Examiner* — Christopher G Young

(74) *Attorney, Agent, or Firm* — Servilla Whitney LLC

(57) ABSTRACT

An extreme ultraviolet reflective element comprising a multilayer stack of absorber layers on a multilayer stack of reflective layers. The element comprises spacing layer and phase tuning layer. Methods of manufacturing extreme ultraviolet reflective elements and lithography systems including extreme ultraviolet reflective elements are also described.

20 Claims, 7 Drawing Sheets

(56) References Cited

U.S. PATENT DOCUMENTS

| | | |
|---|---|---|
| 2014/0272684 A1 | 9/2014 | Hofmann et al. |
| 2015/0024305 A1 | 1/2015 | Lu et al. |
| 2015/0064611 A1 | 3/2015 | Shih |
| 2015/0205298 A1 | 7/2015 | Stoschek et al. |
| 2015/0212402 A1 | 7/2015 | Patil |
| 2015/0279635 A1 | 10/2015 | Subramani et al. |
| 2015/0331307 A1 | 11/2015 | Lu et al. |
| 2016/0011344 A1 | 1/2016 | Beasley et al. |
| 2016/0011499 A1 | 1/2016 | Hassan et al. |
| 2016/0011500 A1 | 1/2016 | Hassan et al. |
| 2016/0011502 A1 | 1/2016 | Hofmann et al. |
| 2016/0147138 A1 | 5/2016 | Shih et al. |
| 2016/0161839 A1 | 6/2016 | Lu et al. |
| 2016/0196485 A1 | 7/2016 | Patterson et al. |
| 2016/0238924 A1 | 8/2016 | Burkhardt et al. |
| 2016/0238939 A1 | 8/2016 | Brunner et al. |
| 2016/0357100 A1 | 12/2016 | Ikuta |
| 2017/0062210 A1 | 3/2017 | Msser et al. |
| 2017/0092533 A1 | 3/2017 | Chakraborty et al. |
| 2017/0140920 A1 | 3/2017 | Arnepalli et al. |
| 2017/0115555 A1 | 4/2017 | Hofmann et al. |
| 2017/0131627 A1 | 5/2017 | Hassan et al. |
| 2017/0131637 A1 | 5/2017 | Hofmann et al. |
| 2017/0136631 A1 | 5/2017 | Li et al. |
| 2017/0160632 A1 | 6/2017 | Hassan et al. |
| 2017/0178877 A1 | 6/2017 | Wang et al. |
| 2017/0235217 A1 | 8/2017 | Qi et al. |
| 2017/0256402 A1 | 9/2017 | Kaufman-Osborn et al. |
| 2017/0263444 A1 | 9/2017 | Shoki et al. |
| 2017/0351169 A1 | 12/2017 | Yu et al. |
| 2018/0031964 A1 | 2/2018 | Jindal |
| 2018/0031965 A1 | 2/2018 | Jindal |
| 2018/0094351 A1 | 4/2018 | Verghese et al. |
| 2018/0120692 A1 | 5/2018 | Ikebe et al. |
| 2018/0291500 A1 | 10/2018 | Wang et al. |
| 2018/0292756 A1 | 10/2018 | Kong et al. |
| 2019/0004420 A1 | 1/2019 | Ozawa et al. |
| 2019/0056653 A1 | 2/2019 | Kawahara et al. |
| 2019/0078177 A1 | 3/2019 | Adelmann et al. |
| 2019/0079383 A1 | 3/2019 | Ikebe |
| 2019/0086791 A1 | 3/2019 | Tanabe |
| 2019/0088456 A1 | 3/2019 | Behara et al. |
| 2019/0113836 A1 | 4/2019 | Sun et al. |
| 2019/0196321 A1 | 6/2019 | Kim et al. |
| 2019/0382879 A1 | 12/2019 | Jindal et al. |
| 2019/0384156 A1 | 12/2019 | Tanabe |
| 2019/0384157 A1 | 12/2019 | Ikebe et al. |
| 2020/0056283 A1 | 2/2020 | Shero et al. |
| 2020/0218145 A1 | 7/2020 | Jindal |
| 2020/0371429 A1 | 11/2020 | Liu et al. |
| 2020/0371431 A1 | 11/2020 | Xiao et al. |

FOREIGN PATENT DOCUMENTS

| | | |
|---|---|---|
| JP | S6376325 A | 4/1988 |
| JP | 2003315977 A | 11/2003 |
| JP | 2007114336 A | 5/2007 |
| JP | 2007273678 A | 10/2007 |
| JP | 2009099931 A | 5/2009 |
| JP | 2012503318 A | 2/2012 |
| JP | 2013120868 A | 6/2013 |
| JP | 2015008283 A | 1/2015 |
| JP | 2001085332 A1 | 5/2018 |
| JP | 2018173664 A | 11/2018 |
| KR | 20070036519 A | 4/2007 |
| KR | 20080001023 A | 1/2008 |
| KR | 100879139 B1 | 1/2009 |
| KR | 100972863 B1 | 7/2010 |
| KR | 20110050427 A | 5/2011 |
| KR | 20110120785 A | 11/2011 |
| KR | 20150056435 A | 5/2015 |
| KR | 20160002332 A | 1/2016 |
| KR | 20160143917 A | 12/2016 |
| KR | 20170021190 A | 2/2017 |
| KR | 20170021191 A | 2/2017 |
| KR | 20180127197 A | 11/2018 |
| TW | 200938502 A | 9/2009 |
| TW | 201331699 A | 8/2013 |
| TW | 201606335 A | 2/2016 |
| WO | 2011157643 A1 | 12/2011 |
| WO | 2013152921 A1 | 10/2013 |
| WO | 2016007613 A1 | 1/2016 |
| WO | 2018156452 A1 | 8/2018 |

OTHER PUBLICATIONS

Machine Translation of JP 2007114336, 23 pages.
Machine Translation of JP 2009099931, 18 pages.
Machine Translation of KR20070036519, 7 pages.
Non-Final Office Action in U.S. Appl. No. 14/620,114 dated Jul. 22, 2016, 10 pages.
Non-Final Office Action in U.S. Appl. No. 15/438,248 dated May 10, 2018, 15 pages.
Non-Final Office Action in U.S. Appl. No. 15/652,501 dated Apr. 20, 2020, 7 pages.
Non-Final Office Action in U.S. Appl. No. 16/512,693 dated Feb. 3, 2021, 16 pages.
Non-Final Office Action in U.S. Appl. No. 16/821,444 dated Aug. 28, 2020, 24 pages.
PCT International Search Report and Written Opinion in PCT/US2015/039525 dated Sep. 18, 2015, 10 pages.
PCT International Search Report and Written Opinion in PCT/US2015/039533 dated Sep. 21, 2015, 11 pages.
PCT International Search Report and Written Opinion in PCT/US2017/042747 dated Nov. 2, 2017, 14 pages.
PCT International Search Report and Written Opinion in PCT/US2017/042748 dated Nov. 2, 2017, 15 pages.
PCT International Search Report and Written Opinion in PCT/US2019/040682 dated Oct. 23, 2019, 13 pages.
PCT International Search Report and Written Opinion in PCT/US2019/042143 dated Oct. 29, 2019, 11 pages.
PCT International Search Report and Written Opinion in PCT/US2019/058013 dated Feb. 14, 2020, 12 pages.
PCT International Search Report and Written Opinion in PCT/US2019/067751 dated Apr. 23, 2020, 10 pages.
PCT International Search Report and Written Opinion in PCT/US2020/016021 dated May 29, 2020, 11 pages.
PCT International Search Report and Written Opinion in PCT/US2020/016022 dated Jun. 5, 2020, 11 pages.
PCT International Search Report and Written Opinion in PCT/US2020/016023, dated Jun. 29, 2020, 11 pages.
PCT International Search Report and Written Opinion in PCT/US2020/020029 dated Jun. 30, 2020, 10 pages.
PCT International Search Report and Written Opinion in PCT/US2020/020031 dated Jun. 30, 2020, 12 pages.
PCT International Search Report and Written Opinion in PCT/US2020/020033 dated Jun. 26, 2020, 11 pages.
PCT International Search Report and Written Opinion in PCT/US2020/020034 dated Jun. 23, 2020, 9 pages.
PCT International Search Report and Written Opinion in PCT/US2020/028669 dated Aug. 7, 2020, 14 pages.
PCT International Search Report and Written Opinion in PCT/US2020/033718 dated Sep. 9, 2020, 12 pages.
PCT International Search Report and Written Opinion in PCT/US2020/033719 dated Sep. 9, 2020, 12 pages.
PCT International Search Report and Written Opinion in PCT/US2020/033722 dated Sep. 1, 2020, 11 pages.
PCT International Search Report and Written Opinion in PCT/US2020/033723 dated Aug. 28, 2020, 12 pages.
PCT International Search Report and Written Opinion in PCT/US2020/033724 dated Sep. 9, 2020, 11 pages.
PCT International Search Report and Written Opinion in PCT/US2020/033725 dated Aug. 28, 2020, 11 pages.
PCT International Search Report and Written Opinion in PCT/US2020/033728 dated Aug. 28, 2020, 11 pages.
PCT International Search Report and Written Opinion in PCT/US2020/033729 dated Sep. 9, 2020, 11 pages.
PCT International Search Report and Written Opinion PCT/US2018/067108 dated May 27, 2019, 13 pages.

(56) References Cited

OTHER PUBLICATIONS

Braun, Stefan, et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale, 3 pages".
Jadhav, Sushilkumar A., "Self-assembled monolayers (SAMs) of carboxylic acids: an overview", Central European Journal of Chemistry, pp. 369-378.
Snow, A. W., et al., "Packing density of HS(CH2)nCOOH self-assembled monolayers", Analyst, 2011, 136, 4935, 4935-4949.
Zon, Jerzy, et al., "Synthesis of Phosphonic Acids and Their Esters as Possible Substrates for Reticular Chemistry", 2012, RCS publishing, Chapter 6, total pp. 36. (Year: 2012).
PCT International Search Report and Written Opinion in PCT/US2021/014105 dated May 12, 2021, 10 pages.
PCT International Search Report and Written Opinion in PCT/US2021/015067 dated May 21, 2021, 9 pages.
PCT International Search Report and Written Opinion in PCT/US2021/015068 dated May 26, 2021, 10 pages.
PCT International Search Report and Written Opinion in PCT/US2021/015069 dated May 21, 2021, 11 pages.
U.S. Appl. No. 16/861,788, filed Oct. 12, 2020, 33 pages.
PCT International Search Report and Written Opinion in PCT/US2020/044712 dated Nov. 27, 2020, 11 pages.
Machine Translation of KR100879139 (B1).

EUV MASK BLANKS AND METHODS OF MANUFACTURE

CROSS-REFERENCE TO RELATED APPLICATIONS

This application claims priority to U.S. Provisional Application No. 62/884,396, filed Aug. 8, 2019, the entire disclosure of which is hereby incorporated by reference herein.

TECHNICAL FIELD

The present disclosure relates generally to EUV mask blanks, and more particularly, to EUV mask blanks including spacing and phase tuning layers, and methods of manufacture.

BACKGROUND

Bragg reflectors are utilized in a wide variety of applications, for example, in EUV mask blanks, optical filters (e.g. band-stop filters, notch filter etc.), fiber Bragg gratings, laser optics, polarizers, and waveguides (e.g. optics for head-mounted displays). Bragg reflectors are typically made of multilayers of alternating thin film materials of different refractive index, wherein high reflectance is one of the key attributes. A Bragg reflector or mirror is a structure formed from a multilayer stack of alternating thin film materials with varying refractive index, for example high- and low-index films. As a result of inter-layer mixing during multi-layer depositions, additional interfacial layers form between adjacent layers of different materials. Bragg reflectors must have high reflectance. The structure and properties of the interfacial layers in the multilayer stack play a vital role in the reflectance of Bragg reflectors.

Extreme ultraviolet (EUV) lithography (EUVL), also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

EUVL using a wavelength of 13.53 nm is expected to be a main production process for sub-22 nm half pitch resolution. Mask shadowing is a unique phenomenon caused by use of a multilayer mirror-based mask with an oblique incident angle of light. One method of minimizing the mask shadowing effect is to reduce the absorber thickness. Another approach is a phase shift mask to improve image contrast with a thinner absorber stack. One type of EUV reflective element 100, shown in FIG. 1 is known as an alternating phase shift mask (PSM). The EUV reflective element shown in FIG. 1 includes an EUV phase shift mask (PSM) and comprises an alternating multilayer absorber 115 comprising a first absorber layer 116 of a first material, such as molybdenum, and a second absorber layer 118 of a second material such as silicon disposed on a capping layer 114 of the EUV reflective element 100. The EUV reflective element 100 can be in the form of an EUV mask blank or an extreme ultraviolet mirror. The EUV reflective element 100 includes a substrate 102, a multilayer stack 110 in the form of a Bragg reflector of reflective layers comprising first reflective layer 106, second reflective layer 108, and a capping layer 114. When an EUV reflective element is used in a high numerical aperture (NA) scanner, to optimize imaging resolution of the PSM, intensity (I) and phase ($\phi$) of reflected light from exposed area 100e ($I_0$ and $\phi_0$) shown as line 120 and covered areas 100c covered by the multilayer absorber 115 shown as line 122 ($I_1$ and $\phi_1$), the mask needs to be optimized.

SUMMARY

In a first aspect of the disclosure, an extreme ultraviolet (EUV) mask blank comprises a substrate; a multilayer stack of reflective layers on the substrate, the multilayer stack of reflective layers including a plurality of reflective layer pairs configured to reflect incident light having an intensity $I_0$ and a phase $\phi_0$; a capping layer on the multilayer stack of reflecting layers; a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and a spacing layer disposed between the capping layer and the multilayer stack of absorber layers and a phase tuning layer in contact with one of the first material A and the second material B.

In a second aspect, a method of manufacturing an extreme ultraviolet (EUV) mask blank is provided, the method comprising: depositing a multilayer stack of reflective layers on a substrate, the multilayer stack of reflective layers including a plurality of reflective layer pairs configured to reflect incident light having an intensity $I_0$ and a phase $\phi_0$; depositing a capping layer on the multilayer stack of reflecting layers; depositing a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and forming a spacing layer between the capping layer and the multilayer stack of absorber layers and a phase tuning layer in contact with one of the first material A and the second material B.

In a third aspect, an extreme ultraviolet reflective element lithography system comprises an extreme ultraviolet light source which produces extreme ultraviolet light; a reflective element configured to reflect the extreme ultraviolet light, the reflective element including: a substrate; a multilayer stack of reflective layers on the substrate, the multilayer stack of reflective layers including a plurality of reflective layer pairs configured to reflect incident light having an intensity $I_0$ and a phase $\phi_0$; a capping layer on the multilayer stack of reflecting layers; a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and a spacing layer disposed between the capping layer and the multilayer stack of absorber layers and a phase tuning layer in contact with one of the first material A and the second material B.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
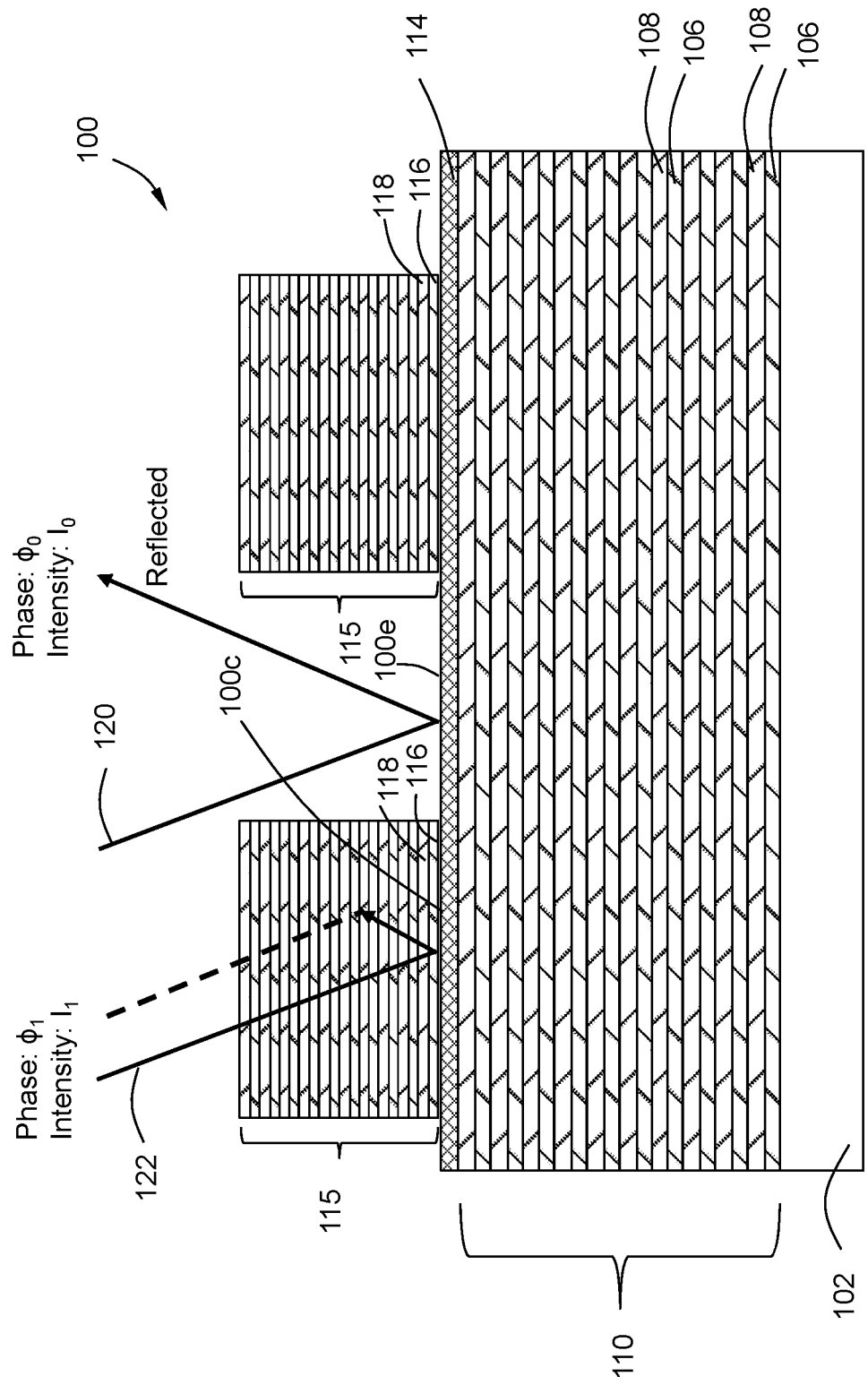
FIG. 1 illustrates an EUV reflective element according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used herein, the term EUV reflective element refers to a structure (e.g. a mirror or mask blank) formed from a multilayer stack of alternating thin film materials with varying refractive index, for example high-index and low-index films. In one or more embodiments, the EUV reflective element is comprised of a multilayer stack of alternating thin film layers of molybdenum (Mo) and silicon (Si).

The disclosure, however, is not limited to alternating thin film layers of molybdenum and silicon. Unless specific materials or structures are recited in the claims of the disclosure, the claims directed to an EUV reflective element are not limited to a particular type of device or specific layer structure. In some embodiments, an EUV reflective element may comprise alternating layers of molybdenum and silicon, or ruthenium and silicon, or zirconium and aluminum, or silicon carbide and magnesium, or chromium and cobalt.

An EUV reflective element such as a mask blank or mirror operates on the principle of a distributed Bragg reflector. A substrate supports a multilayer (ML) mirror of 20-80 pairs of alternating layers of two materials. The two materials have different refractive indices. While the following disclosure provides a specific example of an EUV mask blank including a Bragg reflector of alternating layers of Mo/Si, the principles described herein can be applied to any type of Bragg reflector, including the specific devices and alternating material layers described immediately above.

Lens elements and EUV mask blanks including a Bragg reflector have high reflectivity towards EUV light. The lens elements and mask blanks of extreme ultraviolet lithography systems are coated with the reflective multilayer coatings of materials (e.g., molybdenum and silicon). Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.53 nanometer EUV light.

Referring now to FIGS. 2-5, and a first embodiment of the disclosure pertains to an extreme ultraviolet (EUV) mask blank 200. In the mask blank 100 shown in FIG. 1, the number of Mo/Si multilayers pairs of the multilayer absorber 115 on top of capping layer 114 affect both phase ($\phi_1$) and intensity ($I_1$) of reflected light from the multilayer absorber 115. When phase $\phi_1$ is optimized, intensity $I_1$ may not be the optimum value. When intensity $I_1$ is optimized, phase $\phi_1$ may not be the optimum value. According to one or more embodiments, to optimize overall imaging resolution for PSM mask, the phase $\phi_1$ and intensity are controlled separately.

The EUV reflective element shown in FIG. 1 includes an EUV phase shift mask (PSM) and comprises an alternating multilayer absorber 115 comprising a first absorber layer 116 of a first material, such as molybdenum, and a second absorber layer 118 of a second material such as silicon disposed on a capping layer 114 of the EUV reflective element 100. The EUV reflective element 100 can be in the form of an EUV mask blank or an extreme ultraviolet mirror. The EUV reflective element 100 includes a substrate 102, a multilayer stack 110 in the form of a Bragg reflector of reflective layers comprising a first reflective layer 106, second reflective layer 108, and a capping layer 214.

The EUV mask blank 200, which may be a phase shift mask comprises a substrate 202, a multilayer stack of reflective layers 210 on the substrate, the multilayer stack of reflective layers 210 including a plurality of reflective layer pairs configured to reflect incident light having an intensity $I_0$ and a phase $\phi_0$. The incident light is reflected from exposed area 200e which is not covered by a multilayer absorber 215. The EUV mask blank further comprises a capping layer 214 on the multilayer stack of reflective layers

210. The multilayer stack 210 of reflecting layers comprises a first reflective layer 206, second reflective layer 208.

The mask blank 200 further comprises a multilayer stack of absorber layers 215 on the capping layer 214, the multilayer stack of absorber layers 215 including a plurality of absorber layer pairs, each pair comprising a first material A and a second material B, the multilayer stack of absorber layers 215 configured to reflect incident light having an $I_1$ and a phase $\phi_1$. As shown in FIG. 1 the multilayer stack of absorber layers 215 provides a covered area 200c on the capping layer on the multilayer stack of reflective layers 210.

As shown in FIGS. 2-5, the EUV mask blank 200 further comprises a spacing layer 220 disposed between the capping layer 214 and the multilayer stack of absorber layers 215 and a phase tuning layer 222 in contact with one of the first material A and the second material B.

In a second embodiment, the extreme ultraviolet (EUV) mask blank 200 comprises a spacing layer 220 which as thickness configured to tune intensity of incident light reflected from the multilayer stack of absorber layers ($I_1$) at a specific wavelength, for example, 13.53 nm.

In a third embodiment, the first or second embodiment can include the feature of the multilayer stack of absorber layers 215 covering a portion of the capping layer 214 such that there is a covered area 200c covered by the multilayer absorber area 215 and an exposed area 200e not covered by multilayer stack of absorber layers 215, and the phase tuning layer 222 has thickness configured to tune the phase of light reflected from the multilayer stack of reflective layers so that there is a change in phase $\Delta\phi=\phi1-\phi0$ that is in a range of from 120° to 240°. In specific embodiments, the change in phase is 180°.

Figure 2:
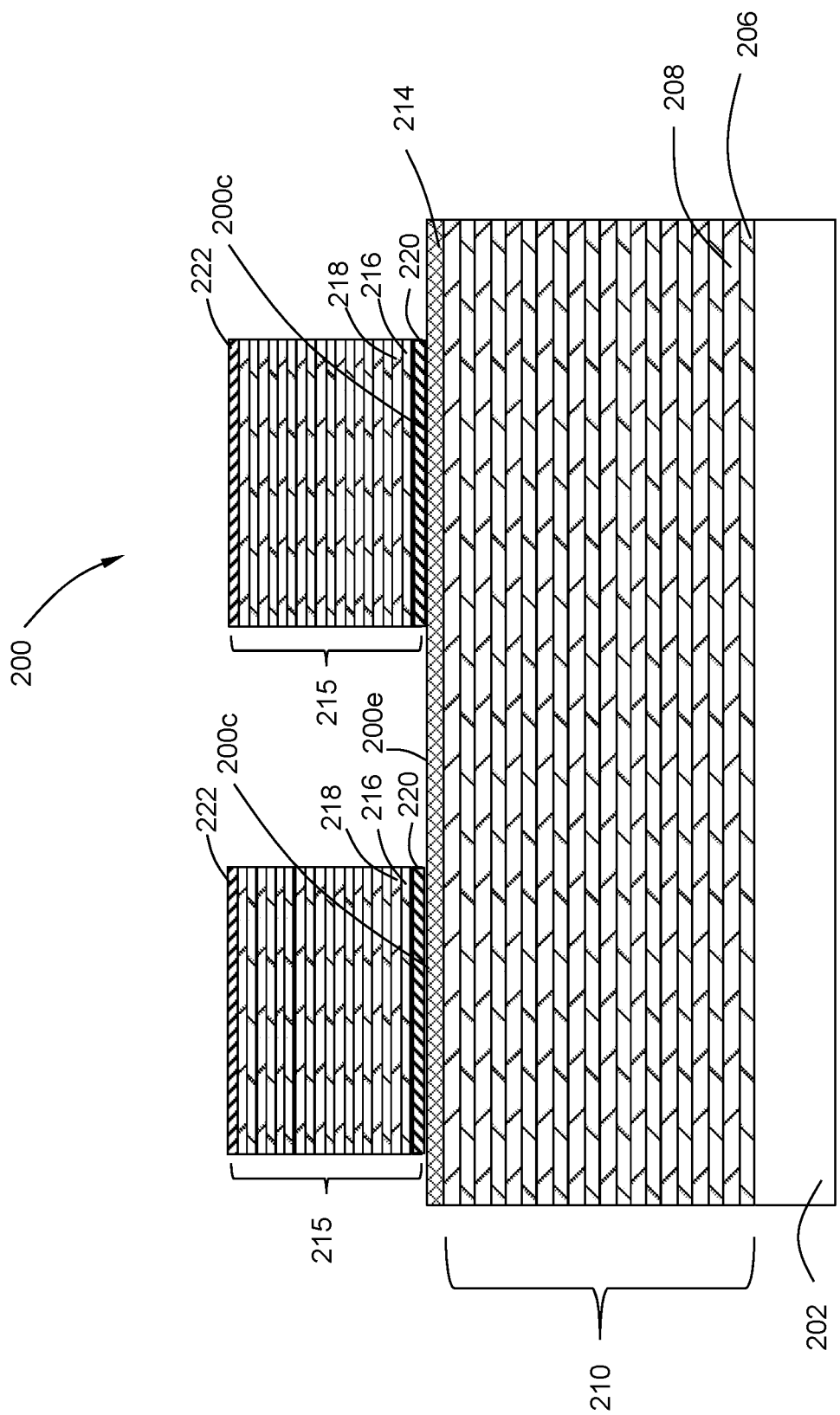
FIG. 2 illustrates an embodiment of an EUV reflective element.
Figure 3:
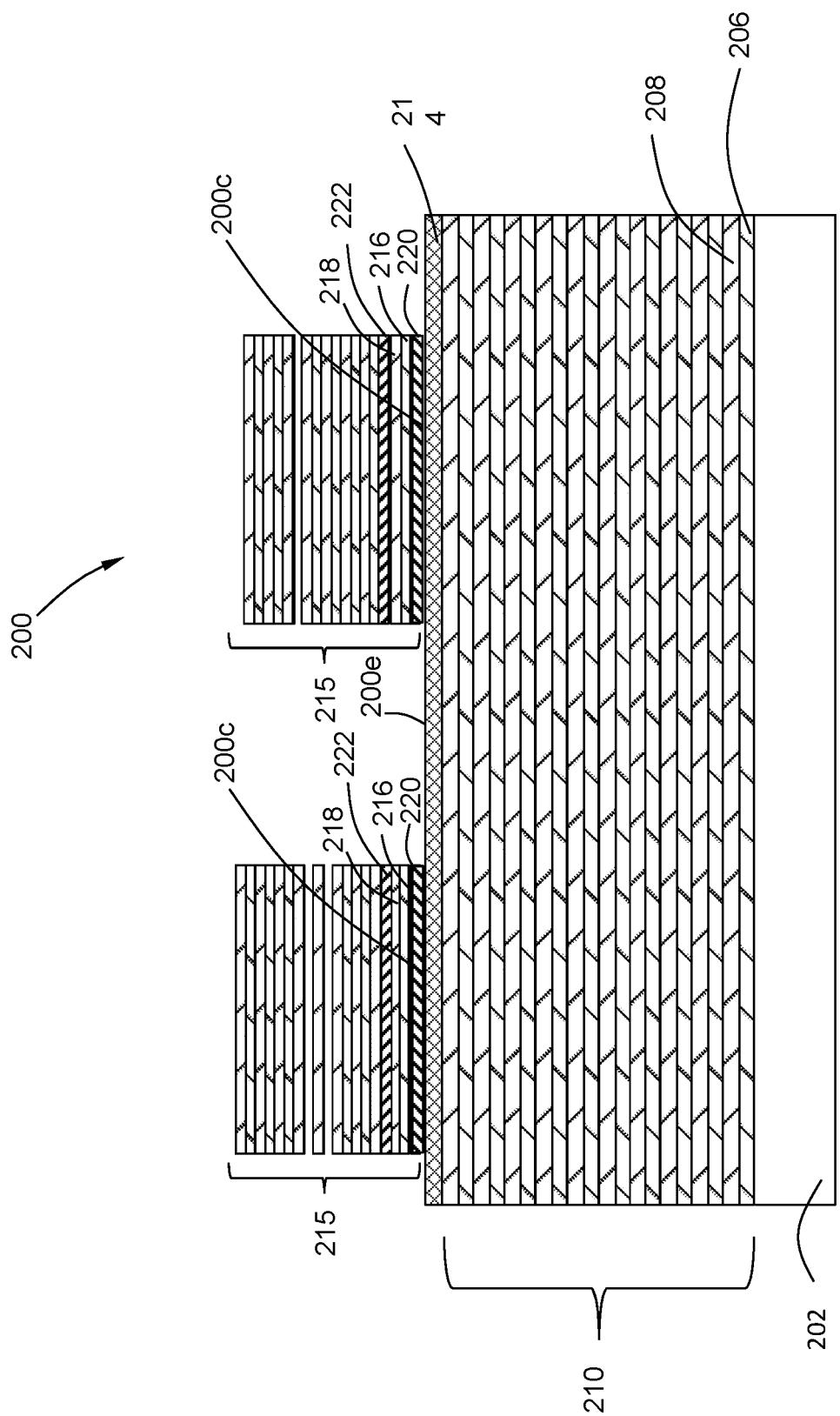
FIG. 3 illustrates an embodiment of an EUV reflective element.
Figure 4:
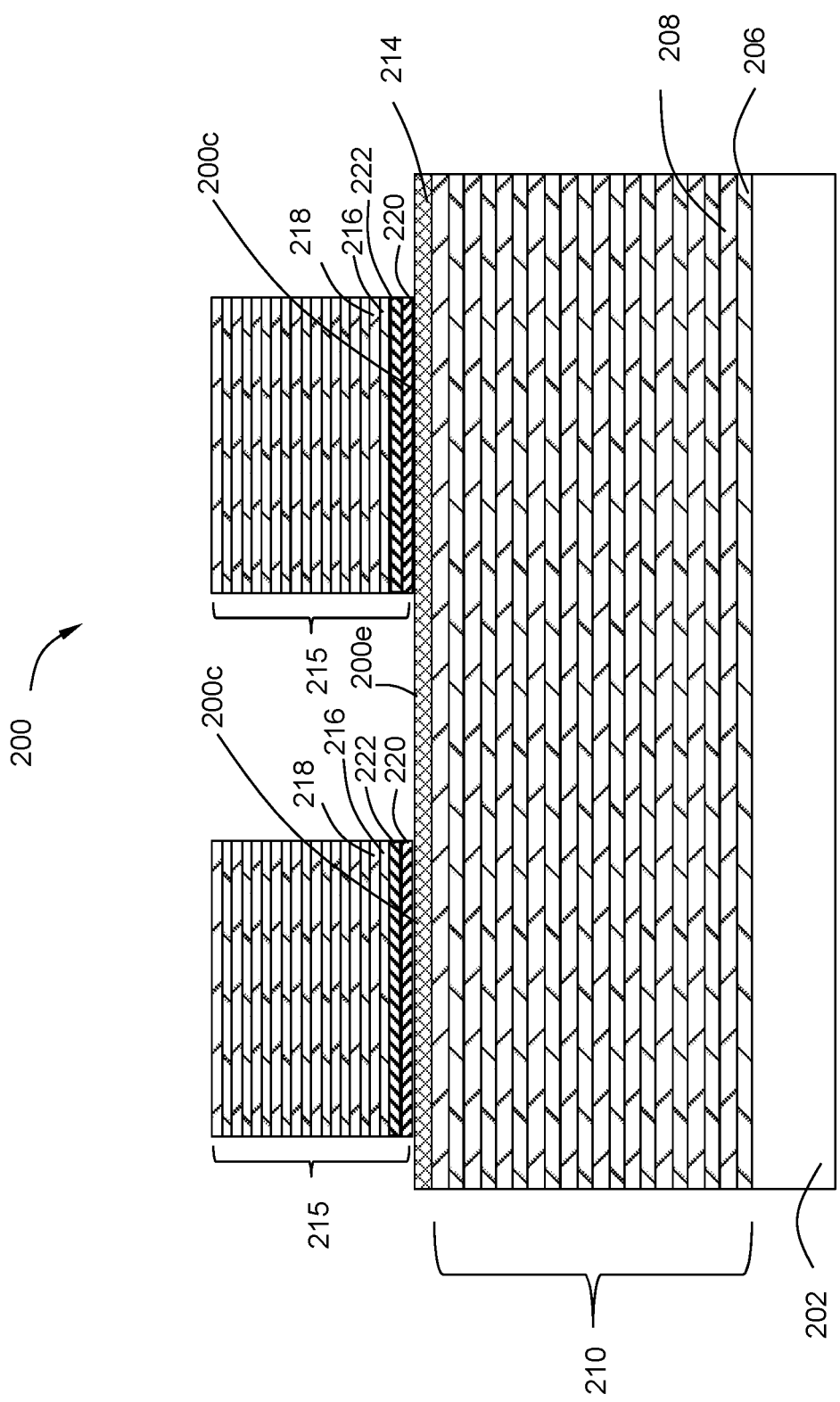
FIG. 4 illustrates an embodiment of an EUV reflective element.
Figure 5:
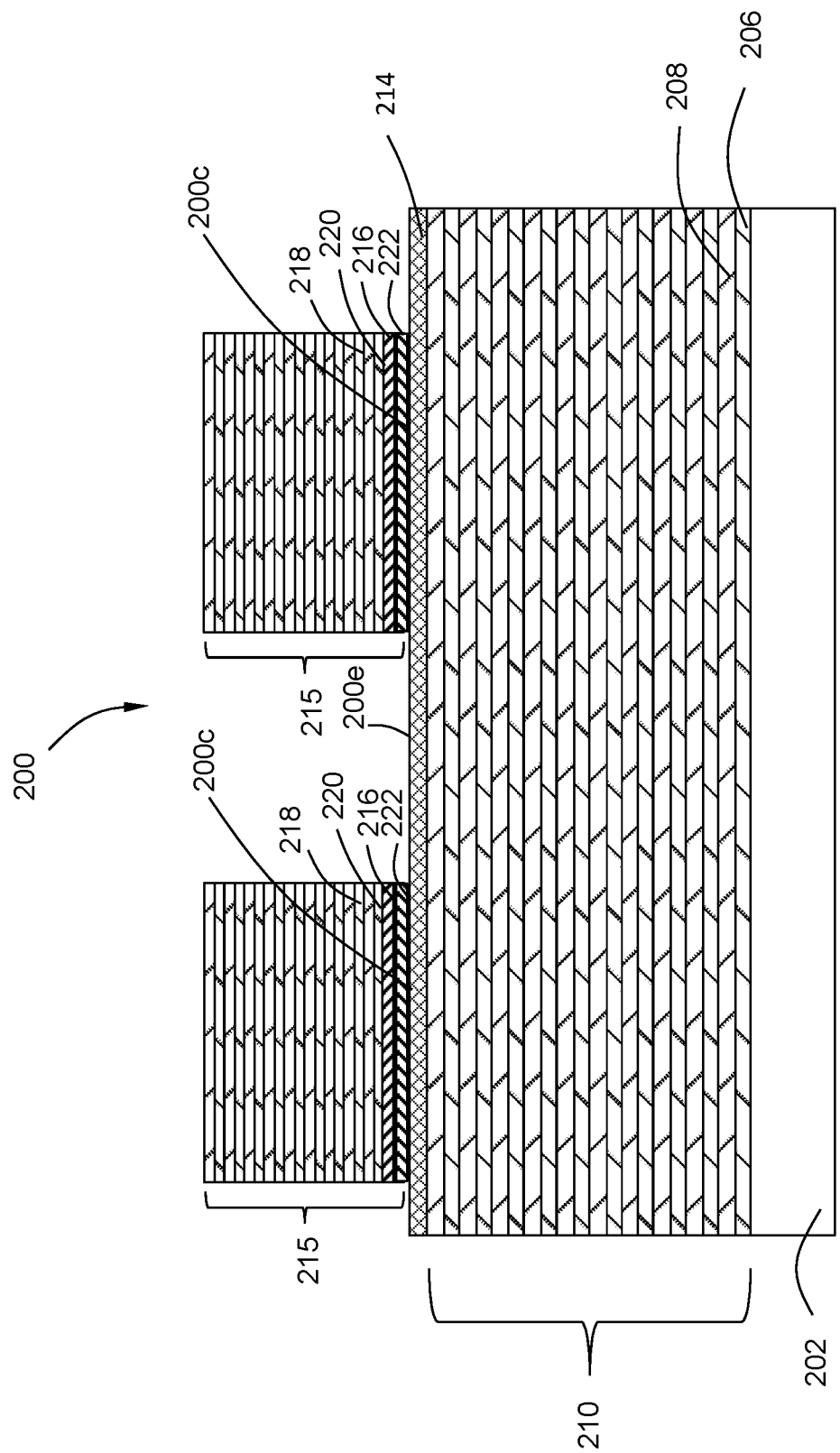
FIG. 5 illustrates an embodiment of an EUV reflective element.

In a fourth embodiment, as shown in FIG. 2, the first through third embodiments can include the feature that the phase tuning layer 222 is on top of the multilayer stack of absorber layers 215 and the spacing layer 220 is directly on the capping layer 214. In a fifth embodiment, as shown in FIG. 3, the first through third embodiments can include the feature that the phase tuning layer 22 is located within the multilayer stack of absorber layers 215 and the spacing layer 220 is directly on the capping layer 214. In a sixth embodiment, as shown in FIG. 4, the first through third embodiments can include the feature that the phase tuning layer 222 is directly on the spacing layer 220, and the spacing layer 220 is directly on the capping layer 214. In a seventh embodiment, as shown in FIG. 5, the first through third embodiments can include the feature that the spacing layer 220 is directly on the phase tuning layer 222, and the phase tuning layer 222 is directly on the capping layer 214.

In an eighth embodiment, the extreme ultraviolet (EUV) mask blank 200 of the first through seventh embodiments can be modified so that the reflective layer pairs comprise molybdenum (Mo) and silicon (Si) and the first material A comprises molybdenum (Mo) and the second material B comprises silicon (Si).

In a ninth embodiment, the first through eighth embodiments can be modified so that the spacing layer 200 comprises a material having an extinction coefficient K less than 0.04. For example, the spacing layer 220 can comprise a material comprising an element selected from the group consisting of Ru, W, Mn, Mo, Nb, Hf, Ti, Zr, Mg, Al, Ge, Se, and Si. In one or more embodiments, the spacing layer 220 can comprise oxides, nitrides, carbides, borides and alloys of these elements.

In a tenth embodiment, the extreme ultraviolet (EUV) mask blank of the first through ninth embodiments can be modified so that the phase tuning layer 222 comprises a material having a refraction coefficient n greater than 0.92. In one or more embodiments, the tuning layer 222 comprises a material comprising an element selected from the group consisting of Cr, Ta, Ti, Fe, Co, Ni, Cu, Zn, Te, Bi, Cd, Ga. In one or more embodiments, the phase tuning layer 222 can comprise oxides, nitrides, carbides, borides and alloys of these elements.

Figures 7A, 7B:
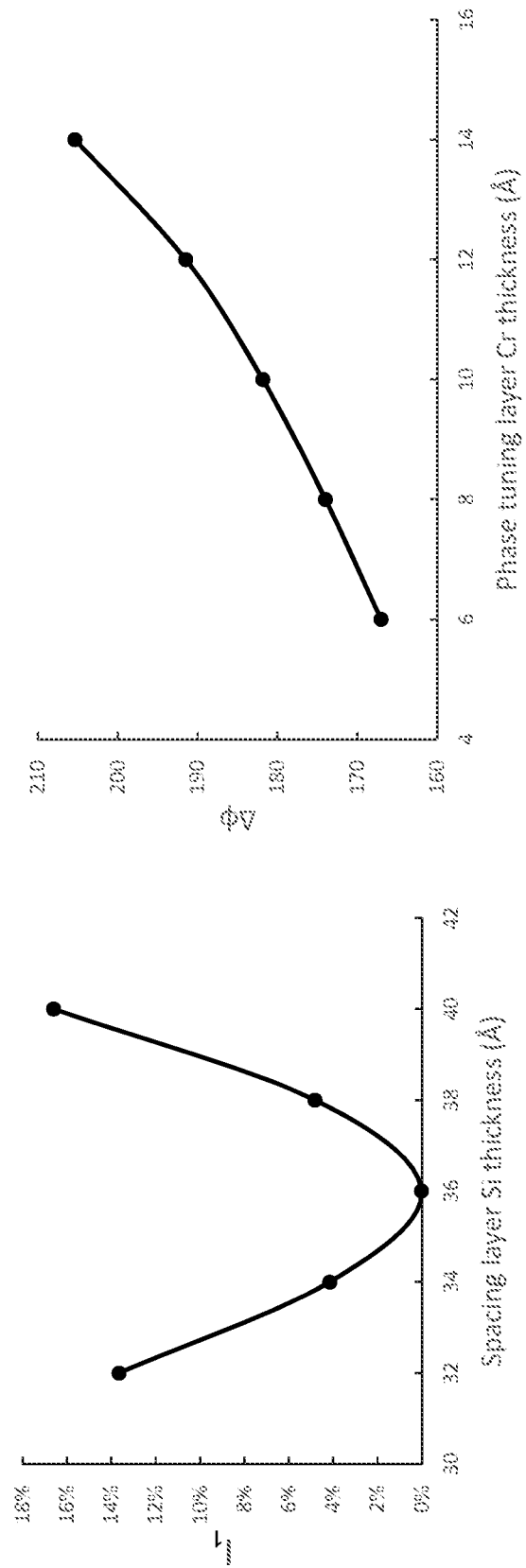
FIG. 7A is a graph of intensity $I_1$ at 13.53 nm as a function of spacing layer thickness according to an embodiment.
FIG. 7B is a graph of phase change $\Delta\phi=\phi_1-\phi_0$ at 13.53 nm as a function of phase tuning layer thickness according to an embodiment.

In specific embodiments, the spacing layer 220 thickness is in a range of 20-50 nm, for example 30-45 nm or 32-40 nm. Intensity I1 at 13.53 nm as a function of spacing layer thickness for a silicon spacing layer varying from 32 to 40 nm is shown in FIG. 7A for an EUV reflective element include a chromium 10 Angstrom thick phase change layer with 14 Mo/Si absorber layer pairs. FIG. 7B shows a phase change $\Delta\phi=\phi_1-\phi_0$ at 13.53 nm as a function of phase tuning layer thickness for a the chromium 10 Angstrom thick phase change layer with 14 Mo/Si absorber layer pairs.

Another aspect of the disclosure pertains to a method of manufacturing an extreme ultraviolet (EUV) mask blank. In an eleventh embodiment, the method comprises depositing a multilayer stack of reflective layers on a substrate, the multilayer stack of reflective layers including a plurality of reflective layer pairs configured to reflect incident light having an intensity $I_0$ and a phase $\phi_0$ and then depositing a capping layer on the multilayer stack of reflecting layers. The method further comprises depositing a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$. The method also comprises forming a spacing layer between the capping layer and the multilayer stack of absorber layers and a phase tuning layer in contact with one of the first material A and the second material B.

In a twelfth embodiment, the spacing layer has thickness configured to tune intensity of incident light reflected from the multilayer stack of absorber layers ($I_1$) at a specific wavelength. In a thirteenth embodiment, the multilayer stack of absorber layers covers a portion of the capping layer such that there is a covered area by the multilayer absorber area and an exposed area not covered by multilayer stack of absorber layers, and wherein the phase tuning layer has thickness configured to tune the phase of light reflected from the multilayer stack of reflective layers so that there is a change in phase $\Delta\phi=\phi_1-I_0$ that is in a range of from 120° to 240°. In a fourteenth embodiment, the phase tuning layer is deposited on top of the multilayer stack of absorber layers and the spacing layer is deposited directly on the capping layer.

In a fifteenth embodiment, the phase tuning layer is located within the multilayer stack of absorber layers and the spacing layer is deposited directly on the capping layer. In a sixteenth embodiment, the phase tuning layer is deposited directly on the spacing layer, and the spacing layer is deposited directly on the capping layer. In a seventeenth embodiment, the spacing layer is deposited directly on the phase tuning layer, and the phase tuning layer is deposited directly on the capping layer.

In an eighteenth embodiment, the reflective layer pairs comprise molybdenum (Mo) and silicon (Si) and the first material A comprises molybdenum (Mo) and the second material B comprises silicon (Si). In a nineteenth embodiment, the spacing layer comprises a material having an extinction coefficient K less than 0.04. In another embodiment of the method, the spacing layer comprises a material comprising an element selected from the group consisting of Ru, W, Mn, Mo, Nb, Hf, Ti, Zr, Mg, Al, Ge, Se, and Si. Some embodiments include oxides, nitrides, carbides, borides and alloys of these elements. In another embodiment of the method, the phase tuning layer comprises a material having a refraction coefficient n greater than 0.92. For example, the phase tuning layer can comprise a material comprising an element selected from the group consisting of Cr, Ta, Ti, Fe, Co, Ni, Cu, Zn, Te, Bi, Cd, Ga. Some embodiments include oxides, nitrides, carbides, borides and alloys of these elements.

A twentieth embodiment includes an extreme ultraviolet reflective element lithography system comprises an extreme ultraviolet light source which produces extreme ultraviolet light; a reflective element configured to reflect the extreme ultraviolet light, the reflective element including: a substrate; a multilayer stack of reflective layers on the substrate, the multilayer stack of reflective layers including a plurality of reflective layer pairs configured to reflect incident light having an intensity $I_0$ and a phase $\phi_0$; a capping layer on the multilayer stack of reflecting layers; a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and a spacing layer disposed between the capping layer and the multilayer stack of absorber layers and a phase tuning layer in contact with one of the first material A and the second material B. In one or more embodiments, the extreme ultraviolet reflective element lithography system comprises any of the first through tenth embodiments described above with respect to the EUV mask blank and FIGS. 2-5, In one or more embodiments, the substrate 202 is an element for providing structural support to the extreme ultraviolet reflective element 200. In one or more embodiments, the substrate 202 is made from a material having a low coefficient of thermal expansion (CTE) to provide stability during temperature changes. In one or more embodiments, the substrate 202 has properties such as stability against mechanical cycling, thermal cycling, crystal formation, or a combination thereof. The substrate 202 according to one or more embodiments is formed from a material such as silicon, glass, oxides, ceramics, glass ceramics, or a combination thereof.

According to one or more embodiments, the multilayer stack of reflective layers 210 include the first reflective layer 206 and the second reflective layer 208, which form a reflective pair. In a non-limiting embodiment, the multilayer stack of reflective layers 210 includes a range of about 20 to about 60 of the reflective pairs for a total of up to 120 reflective layers.

The first reflective layer 206 and the second reflective layer 208 can be formed from a variety of materials. In one or more embodiments, the first reflective layer 206 and the second reflective layer 208 are formed from silicon and molybdenum, respectively. Although the layers are shown as silicon and molybdenum, it is understood that the alternating layers can be formed from other materials or have other internal structures.

The first reflective layer 206 and the second reflective layer 208 can have a variety of structures. In one or more embodiments, both the first reflective layer 206 and the second reflective layer 208 are formed with a single layer, multiple layers, a divided layer structure, non-uniform structures, or a combination thereof.

Because most materials absorb light at extreme ultraviolet wavelengths, the optical elements used are reflective instead of the transmissive as used in other lithography systems. The multilayer stack of reflective layers 210 forms a reflective structure by having alternating thin layers of materials with different optical properties to create a Bragg reflector or mirror.

In one or more embodiments, each of the alternating layers 206, 208 has dissimilar optical constants for the extreme ultraviolet light. The alternating layers 206, 208 provide a resonant reflectivity when the period of the thickness of the alternating layers 206, 208 is one half the wavelength of the extreme ultraviolet light. In one or more embodiments, for the extreme ultraviolet light at a wavelength of 13 nm, the alternating layers 206, 208 are about 6.5 nm thick.

The multilayer stack of reflective layers 210 can be formed in a variety of ways. In an embodiment, the first reflective layer 206 and the second reflective layer 208 are formed by magnetron sputtering, ion sputtering systems, pulsed laser deposition, cathode arc deposition, or a combination thereof.

In an illustrative embodiment, the multilayer stack of reflective layers 210 is formed using a physical vapor deposition technique, such as magnetron sputtering. In an embodiment, the first reflective layer 206 and the second reflective layer 208 of the multilayer stack 210 have the characteristics of being formed by the magnetron sputtering technique including precise thickness, low roughness, and clean interfaces between the layers. In an embodiment, the first reflective layer 206 and the second reflective layer 208 the multilayer stack of reflective layers 210 have the characteristics of being formed by the physical vapor deposition including precise thickness, low roughness, and clean interfaces between the layers.

The physical dimensions of the layers of the multilayer stack of reflective layers 210 formed using the physical vapor deposition technique can be precisely controlled to increase reflectivity. In an embodiment, the first reflective layer 206, such as a layer of silicon, has a thickness of 4.1 nm. The second reflective layer 208, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.53 nm can be reduced.

In an embodiment, the multilayer stack of reflective layers 210 has a reflectivity of greater than 60%. In an embodiment, the multilayer stack 210 formed using physical vapor deposition has a reflectivity in a range of 66%-67%. In one or more embodiments, forming the capping layer 214 over the multilayer stack of reflective layers 210 formed with harder materials improves reflectivity. In some embodiments, reflectivity greater than 70% is achieved using low roughness layers, clean interfaces between layers, improved layer materials, or a combination thereof.

In one or more embodiments, the capping layer 214 is a protective layer allowing the transmission of the extreme ultraviolet light. In an embodiment, the capping layer 214 is formed directly on the multilayer stack of reflective layers 210. In one or more embodiments, the capping layer 214 protects the multilayer stack 210 from contaminants and mechanical damage. In one embodiment, the multilayer stack of reflective layers 210 is sensitive to contamination by oxygen, carbon, hydrocarbons, or a combination thereof. The capping layer 214 according to an embodiment interacts with the contaminants to neutralize them.

In one or more embodiments, the capping layer 214 is an optically uniform structure that is transparent to the extreme ultraviolet light. The extreme ultraviolet light passes through the capping layer 214 to reflect off of the multilayer stack of reflective layers 210. In one or more embodiments, the capping layer 214 has a total reflectivity loss of 1% to 2%. In one or more embodiments, each of the different materials has a different reflectivity loss depending on thickness, but all of them will be in a range of 1% to 2%.

In one or more embodiments, the capping layer 214 has a smooth surface. For example, the surface of the capping layer 214 can have a roughness of less than 0.2 nm RMS (root mean square measure). In another example, the surface of the capping layer 214 has a roughness of 0.08 nm RMS for a length in a range of 1/100 nm and 1/1 µm. The RMS roughness will vary depending on the range it is measured over. For the specific range of 100 nm to 1 micron that roughness is 0.08 nm or less. Over a larger range the roughness will be higher.

The capping layer 214 can be formed in a variety of methods. In an embodiment, the capping layer 214 is formed on or directly on the multilayer stack 210 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 214 has the physical characteristics of being formed by the magnetron sputtering technique including precise thickness, low roughness, and clean interfaces between the layers. In an embodiment, the capping layer 214 has the physical characteristics of being formed by the physical vapor deposition including precise thickness, low roughness, and clean interfaces between the layers.

In one or more embodiments, the capping layer 214 is formed from a variety of materials having a hardness sufficient to resist erosion during cleaning. In one embodiment, ruthenium is used as a capping layer material because it is a good etch stop and is relatively inert under the operating conditions. However, it is understood that other materials can be used to form the capping layer 214. In specific embodiments, the capping layer 214 has a thickness of in a range of 2.5 and 5.0 nm.

In one or more embodiments, multilayer absorber 215 is a plurality of layers that absorbs the extreme ultraviolet light.

Figure 6:
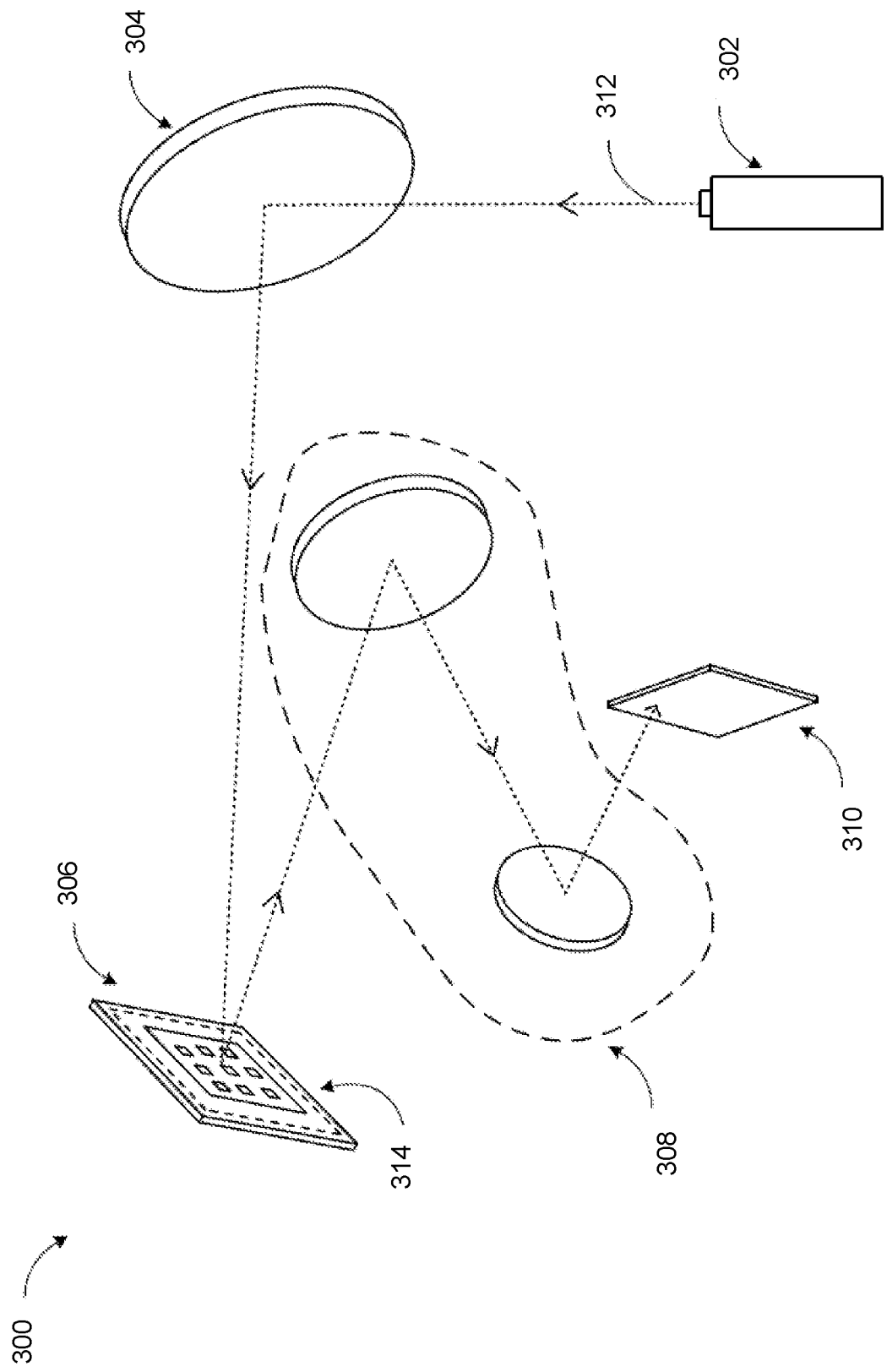
FIG. 6 schematically illustrates an embodiment of an extreme ultraviolet lithography system.

Referring now to FIG. 6, an exemplary embodiment of an extreme ultraviolet lithography system 300 is shown. The extreme ultraviolet lithography system 300 includes an extreme ultraviolet light source 302 which produces extreme ultraviolet light 312, a set of reflective elements, and a target substrate or wafer 310. The reflective elements include a condenser 304, an EUV reflective mask 306, an optical reduction assembly 308, a mask blank, a mirror, or a combination thereof.

The extreme ultraviolet light source 302 generates the extreme ultraviolet light 312. The extreme ultraviolet light 312 is electromagnetic radiation having a wavelength in a range of 5 to 50 nanometers (nm). For example, the extreme ultraviolet light source 302 includes a laser, a laser produced plasma, a discharge produced plasma, a free-electron laser, synchrotron radiation, or a combination thereof.

In one or more embodiments, the extreme ultraviolet light source 302 produces the extreme ultraviolet light 312 having a narrow bandwidth. For example, the extreme ultraviolet light source 302 generates the extreme ultraviolet light 312 at 13.53 nm. The center of the wavelength peak is 13.53 nm.

The condenser 304 is an optical unit for reflecting and focusing the extreme ultraviolet light 312. The condenser 304 reflects and concentrates the extreme ultraviolet light 312 from the extreme ultraviolet light source 302 to illuminate the EUV reflective mask 306.

Although the condenser 304 is shown as a single element, it is understood that the condenser 304 can include one or more reflective elements such as concave mirrors, convex mirrors, flat mirrors, or a combination thereof, for reflecting and concentrating the extreme ultraviolet light 312. For example, the condenser 304 can be a single concave mirror or an optical assembly having convex, concave, and flat optical elements.

The EUV reflective mask 306 is an extreme ultraviolet reflective element having a mask pattern 314. The EUV reflective mask 306 creates a lithographic pattern to form a circuitry layout to be formed on the target wafer 310. The EUV reflective mask 306 reflects the extreme ultraviolet light 312. The mask pattern 314 defines a portion of a circuitry layout.

The optical reduction assembly 308 is an optical unit for reducing the image of the mask pattern 314. The reflection of the extreme ultraviolet light 312 from the EUV reflective mask 306 is reduced by the optical reduction assembly 308 and reflected on to the target wafer 310. The optical reduction assembly 308 can include mirrors and other optical elements to reduce the size of the image of the mask pattern 314. For example, the optical reduction assembly 308 can include concave mirrors for reflecting and focusing the extreme ultraviolet light 312.

The optical reduction assembly 308 reduces the size of the image of the mask pattern 314 on the target wafer 310. For example, the mask pattern 314 can be imaged at a 4:1 ratio by the optical reduction assembly 308 on the target wafer 310 to form the circuitry represented by the mask pattern 314 on the target wafer 310. The extreme ultraviolet light 312 can scan the reflective mask 306 synchronously with the target substrate or wafer 310 to form the mask pattern 314 on the target substrate or wafer 310.

Thus, any of the extreme ultraviolet elements described with respect to the first through tenth embodiments and FIGS. 2-5 herein are be used to provide extreme ultraviolet mirror or an EUV mask blank. An EUV mirror is a multilayered structure reflective in a range of extreme ultraviolet light. The extreme ultraviolet mirror can be formed using semiconductor fabrication techniques. An EUV mask blank and an extreme ultraviolet mirror can be similar structures with respect to the layers formed on each element, however, the extreme ultraviolet mirror does not have a mask pattern.

In specific embodiments, the spacing layer 220 thickness is in a range of 20-50 nm, for example 30-45 nm or 32-40 nm. Intensity I1 at 13.53 nm as a function of spacing layer thickness for a silicon spacing layer varying from 32 to 40 nm is shown in FIG. 7A for an EUV reflective element include a chromium 10 Angstrom thick phase change layer with 14 Mo/Si absorber layer pairs. FIG. 7B shows a phase change $\Delta\phi=\phi_1-\phi_0$ at 13.53 nm as a function of phase tuning layer thickness for a the chromium 10 Angstrom thick phase change layer with 14 Mo/Si absorber layer pairs.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising:
    a substrate;
    a multilayer stack of reflective layers on the substrate, the multilayer stack of reflective layers including a plurality of reflective layer pairs configured to reflect incident light having an intensity $I_0$ and a phase $\phi_0$;
    a capping layer on the multilayer stack of reflecting layers;
    a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and
    a spacing layer disposed between the capping layer and the multilayer stack of absorber layers and a phase tuning layer in contact with one of the first material A and the second material B.

2. The extreme ultraviolet (EUV) mask blank of claim 1, wherein the spacing layer has thickness configured to tune intensity of incident light reflected from the multilayer stack of absorber layers ($I_1$) at a specific wavelength.

3. The extreme ultraviolet (EUV) mask blank of claim 1, the multilayer stack of absorber layers covering a portion of the capping layer such that there is a covered area by the multilayer absorber and an exposed area not covered by multilayer stack of absorber layers, and wherein the phase tuning layer has thickness configured to tune the phase of light reflected from the multilayer stack of reflective layers so that there is a change in phase $\Delta\phi=\phi_1-\phi_0$ that is in a range of from 120° to 240°.

4. The extreme ultraviolet (EUV) mask blank of claim 1, wherein the phase tuning layer is on top of the multilayer stack of absorber layers and the spacing layer is directly on the capping layer.

5. The extreme ultraviolet (EUV) mask blank of claim 1, wherein the phase tuning layer is located within the multilayer stack of absorber layers and the spacing layer is directly on the capping layer.

6. The extreme ultraviolet (EUV) mask blank of claim 1, wherein the phase tuning layer is directly on the spacing layer, and the spacing layer is directly on the capping layer.

7. The extreme ultraviolet (EUV) mask blank of claim 1, wherein the spacing layer is directly on the phase tuning layer, and the phase tuning layer is directly on the capping layer.

8. The extreme ultraviolet (EUV) mask blank of claim 1, wherein the reflective layer pairs comprise molybdenum (Mo) and silicon (Si) and the first material A comprises molybdenum (Mo) and the second material B comprises silicon (Si).

9. The extreme ultraviolet (EUV) mask blank of claim 1, wherein the spacing layer comprises a material having an extinction coefficient K less than 0.04 and a material comprising an element selected from the group consisting of Ru, W, Mn, Mo, Nb, Hf, Ti, Zr, Mg, Al, Ge, Se, and Si.

10. The extreme ultraviolet (EUV) mask blank of claim 9, wherein the phase tuning layer comprises a material having a refraction coefficient n greater than 0.92 and a material comprising an element selected from the group consisting of Cr, Ta, Ti, Fe, Co, Ni, Cu, Zn, Te, Bi, Cd, Ga.

11. A method of manufacturing an extreme ultraviolet (EUV) mask blank, the method comprising:
    depositing a multilayer stack of reflective layers on a substrate, the multilayer stack of reflective layers including a plurality of reflective layer pairs configured to reflect incident light having an intensity $I_0$ and a phase $\phi_0$;
    depositing a capping layer on the multilayer stack of reflecting layers;
    depositing a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and
    forming a spacing layer between the capping layer and the multilayer stack of absorber layers and a phase tuning layer in contact with one of the first material A and the second material B.

12. The method of claim 11, wherein the spacing layer has thickness configured to tune intensity of incident light reflected from the multilayer stack of absorber layers ($I_1$) at a specific wavelength.

13. The method of claim 11, wherein the multilayer stack of absorber layers covers a portion of the capping layer such that there is a covered area by the multilayer absorber and an exposed area not covered by multilayer stack of absorber layers, and wherein the phase tuning layer has thickness configured to tune the phase of light reflected from the multilayer stack of reflective layers so that there is a change in phase $\Delta\phi=\phi_1-\phi_0$ that is in a range of from 120° to 240°.

14. The method of claim 11, wherein the phase tuning layer is deposited on top of the multilayer stack of absorber layers and the spacing layer is deposited directly on the capping layer.

15. The method of claim 11, wherein the phase tuning layer is located within the multilayer stack of absorber layers and the spacing layer is deposited directly on the capping layer.

16. The method of claim 11, wherein the phase tuning layer is deposited directly on the spacing layer, and the spacing layer is deposited directly on the capping layer.

17. The method of claim 11, wherein the spacing layer is deposited directly on the phase tuning layer, and the phase tuning layer is deposited directly on the capping layer.

18. The method of claim 13, wherein the reflective layer pairs comprise molybdenum (Mo) and silicon (Si) and the first material A comprises molybdenum (Mo) and the second material B comprises silicon (Si).

19. The method of claim 18, wherein the spacing layer comprises a material having an extinction coefficient K less than 0.04 and a material comprising an element selected from the group consisting of Ru, W, Mn, Mo, Nb, Hf, Ti, Zr, Mg, Al, Ge, Se, and Si and the phase tuning layer comprises a material having a refraction coefficient n greater than 0.92 and a material comprising an element selected from the group consisting of Cr, Ta, Ti, Fe, Co, Ni, Cu, Zn, Te, Bi, Cd, Ga.

20. An extreme ultraviolet (EUV) mask blank comprising:
a substrate;
a multilayer stack of reflective layers on the substrate, the multilayer stack of reflective layers including a plurality of reflective layer pairs configured to reflect incident light having an intensity $I_0$ and a phase $\phi_0$;
a capping layer on the multilayer stack of reflecting layers;
a multilayer stack of absorber layers on the capping layer, the multilayer stack of absorber layers including a plurality of absorber layer pairs, each pair comprising a first material A and a second material B, the multilayer stack of absorber layers configured to reflect incident light having an $I_1$ and a phase $\phi_1$; and
a spacing layer disposed between the capping layer and the multilayer stack of absorber layers and a phase tuning layer in contact with one of the first material A and the second material B, wherein the first material A comprises molybdenum (Mo) and the second material B comprises silicon (Si) and the phase tuning layer is: (1) on top of the multilayer stack of absorber layers and the spacing layer is directly on the capping layer; (2) located within the multilayer stack of absorber layers and the spacing layer is directly on the capping layer; (3) located within the multilayer stack of absorber layers and the spacing layer is directly on the capping layer; (4) located within the multilayer stack of absorber layers and the spacing layer is directly on the capping layer; or (5) directly on the spacing layer, and the spacing layer is directly on the capping layer.

* * * * *